(12) United States Patent
Geissler et al.

(10) Patent No.: US 8,331,099 B2
(45) Date of Patent: Dec. 11, 2012

(54) METHOD FOR FIXING AN ELECTRICAL OR AN ELECTRONIC COMPONENT, PARTICULARLY A PRINTED-CIRCUIT BOARD, IN A HOUSING AND FIXING ELEMENT THEREFOR

(75) Inventors: Alexander Geissler, Buergel (DE); Udo Hennel, Sachsenheim (DE)

(73) Assignee: Robert Bosch GmbH, Stuttgart (DE)

( * ) Notice: Subject to any disclaimer, the term of this patent is extended or adjusted under 35 U.S.C. 154(b) by 680 days.

(21) Appl. No.: 12/305,187

(22) PCT Filed: Jun. 12, 2007

(86) PCT No.: PCT/EP2007/055750
§ 371 (c)(1),
(2), (4) Date: Nov. 23, 2009

(87) PCT Pub. No.: WO2007/147750
PCT Pub. Date: Dec. 27, 2007

(65) Prior Publication Data
US 2010/0061068 A1    Mar. 11, 2010

(30) Foreign Application Priority Data
Jun. 16, 2006    (DE) .......................... 10 2006 027 779

(51) Int. Cl.
*H05K 5/00*    (2006.01)

(52) U.S. Cl. ........ 361/758; 361/752; 361/759; 361/804; 361/807; 439/66; 439/591

(58) Field of Classification Search ................... 361/752, 361/758, 759, 748, 789, 785, 784, 790, 804, 361/807; 439/66, 591, 824
See application file for complete search history.

(56) References Cited

U.S. PATENT DOCUMENTS

| 3,688,635 | A | 9/1972 | Fegen |
| 5,671,123 | A | 9/1997 | Omori et al. |
| 5,713,690 | A | 2/1998 | Corbin et al. |
| 5,999,414 | A | 12/1999 | Baker et al. |
| 6,722,923 | B2* | 4/2004 | Huang .................... 439/607.53 |
| 7,489,523 | B2* | 2/2009 | Hsu ................................ 361/801 |
| 2002/0085359 | A1* | 7/2002 | Masterton et al. ............ 361/759 |
| 2002/0149916 | A1 | 10/2002 | Kurle et al. |

(Continued)

FOREIGN PATENT DOCUMENTS

| CN | 2475256 | 1/2002 |
| DE | 299 11 037 | 10/1999 |
| DE | 101 61 104 | 7/2003 |
| DE | 297 24 785 | 2/2004 |
| EP | 0 359 223 | 3/1990 |

OTHER PUBLICATIONS

International Search Report, PCT/EP2007/055750 dated Sep. 18, 2007.

*Primary Examiner* — Hoa C Nguyen
(74) *Attorney, Agent, or Firm* — Kenyon & Kenyon LLP

(57) ABSTRACT

In a method for fixing an electrical or an electronic component, particularly a printed-circuit board, in a housing used to accommodate the component, and a fixing element for fixing the component by clamping it in place, the component is fitted with at least one fixing element, which includes an elastically yielding press-on part which, during the clamping in place of the component in the housing, is brought to lie against a part of the housing and is pressed against it while being deformed.

14 Claims, 5 Drawing Sheets

U.S. PATENT DOCUMENTS

2003/0232538 A1* 12/2003 Huang .......................... 439/608
2005/0180121 A1* 8/2005 Chen et al. ................... 361/752
2006/0044745 A1* 3/2006 Kim .............................. 361/681
2009/0045562 A1* 2/2009 Reisel et al. ................. 267/249

* cited by examiner

METHOD FOR FIXING AN ELECTRICAL OR AN ELECTRONIC COMPONENT, PARTICULARLY A PRINTED-CIRCUIT BOARD, IN A HOUSING AND FIXING ELEMENT THEREFOR

FIELD OF THE INVENTION

The present invention relates to a method for fixing an electrical or an electronic component, particularly a printed-circuit board, in a housing used for accommodating the component, a fixing element for fixing an electrical or an electronic component in a housing by clamping it in place, and an electrical or an electronic component, particularly a printed-circuit board.

BACKGROUND INFORMATION

The most varied technical design approaches exist for fixing electrical or electronic components, particularly printed-circuit boards in a surrounding housing. The printed-circuit board may be firmly screwed or adhered into the housing, for example, or may be connected to the housing by clipping it on. However, such connections are not free of disadvantages. Whereas an adhesive connection is no longer detachable after manufacturing, and may additionally lead to damage of the printed-circuit board or of the components mounted on it because of the chemical substances contained in the adhesive, screwed connections and clip-on connections are detachable, to be sure, but they put high requirements on the tolerances of the printed-circuit board and the housing. The latter also applies to clamping connections that are already known per se, in which, for instance, a printed-circuit board is directly clamped in place between two halves of the housing, when the housing is closed. In addition, the mechanical stresses on the printed-circuit board may be very high in such a location.

SUMMARY

Example embodiment of the present invention provide a method, a fixing element and an electrical or an electronic component of the type mentioned at the outset, to the extent that a secure, firm and durable fixing of the component in the housing is possible without special tolerance requirements.

Example embodiments of the present invention provide for fitting the component with at least one fixing element which includes an elastically yielding press-on part which, when the component is clamped in place in the housing, is brought into contact with a part of the housing, and is pressed against it while undergoing deformation.

According to example embodiments of the present invention, at the interfaces between the electrical or the electronic component and the housing, that is, in the place where the clamping forces are transferred from the housing to the component, instead of having a direct transfer of the clamping forces, one should select an indirect transfer, via an elastically yielding intermediate member, that is fit in between the component and the housing, so as to compensate for tolerances or play that may possibly be present in the area of the clamping connection. Since the elastically yielding press-on part is able to be deformed more or less severely, in correspondence to the respective installment conditions, the tolerance requirements on the housing and on the component itself may be considerably reduced. Furthermore, the different thermal expansions of the component and the housing may be compensated for via the elastically yielding press-on part of the at least one fixing element. In addition, with the aid of the elastically yielding press-on part, the contact surface between the component and the housing is able to be enlarged, which, because of lower surface pressures, leads to a reduction in the mechanical stresses caused by the clamping connection, and thus to an extension in the service life of the component. In addition, if the material is selected suitably, the elastically yielding press-on part also acts as a damping member, which damps the transfer of vibrations from the housing to the component, and consequently ensures, at least partially, a decoupling of the component from the housing according to vibration technology.

The method according to example embodiments of the present invention provides that the fixing element is fastened on the component by soldering, especially if the latter is a printed-circuit board. This type of fastening has the advantage that the fixing element is able to be applied, using an already present placement system, in the same manner as other components that are to be mounted on the printed-circuit board, so that the printed-circuit board is able to be fitted with the fixing element(s) using only slight additional effort, in the course of its manufacture.

In the case of other electrical or electronic components, which are also able to be fixed in a housing by being clamped in place, such as electrolytic capacitors, tabs or the like, the fixing element is expediently able to be fixed to the component by adhesion, which is possible to do without great additional effort even before mounting the component in the housing.

The press-on part of the fixing element is made up advantageously, at least in part, of an elastic plastic material, such as polytetrafluoroethylene (PTFE) or an elastomer, such as polyurethane foam or a thermoplastic elastomer (TPE). A rubber elastic material may also be used, however, such as ethylenepropylenediene rubber (EPDM) or a silicone, as long as this material is elastically yielding when a clamping force is applied, and is able to be applied without difficulty onto a suitable carrier of the fixing element.

Example embodiments of the present invention provide also using the fixing element for contacting between the electrical or electronic component, such as the printed-circuit board, and the surrounding housing, by making the press-on part and a part of the housing acting on the press-on part at least partially of an electrically conductive material, which, in the case of the press-on part, is preferably made up of an elastomer filled with graphite, and in the case of the housing part may expediently be developed as a metallic contact finger. In this way, additional contact measures between the electrical or electronic component and its housing become superfluous.

Example embodiments of the present invention are explained below in more detail with the aid of the corresponding drawings.

DETAILED DESCRIPTION

Figure 1:
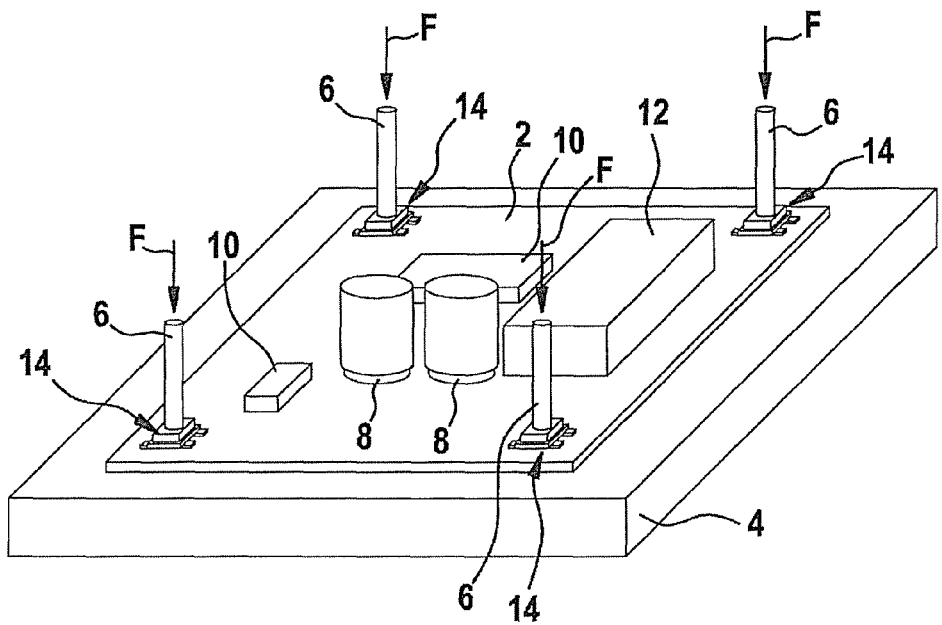
FIG. 1 is a perspective view of a printed-circuit board fitted with four fixing elements.

The printed-circuit board 2, shown best in a drawing in FIG. 1, is fixed in a housing a clamping connection, by pressing it on from above by its underside against a firm, even substratum 4, for instance, a floor of the housing. The pressing-on of printed-circuit board 2 against substratum 4 takes place with the aid of a plurality of cylindrical holding pins or similar extended housing projections 6, which project, for instance, above the lower side of the cover (not shown) of the housing, and, when the cover is closed, extend downwards into the vicinity of printed-circuit board 2, past a plurality of electronic components mounted on the face of printed-circuit board 2, such as capacitors 8, memory chips 10, processors 12 and the like, where they exert in each case a clamping force (arrows F) on a fixing element 14 that is rigidly mounted below each projection 6 on the face of printed-circuit board 2, in order to press fixing element 14, and via it, printed-circuit board 2, downwards against substratum 4, and thus ensure the fixing of printed-circuit board 2 in the housing.

Figure 2:
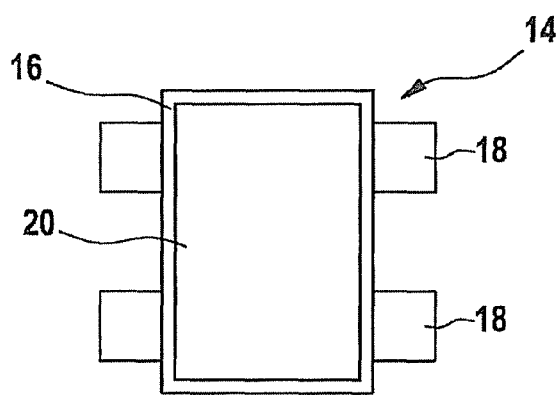
FIG. 2 is a top view of one of the fixing elements according to FIG. 1.
Figure 3:
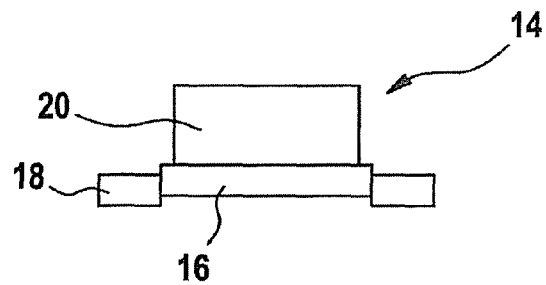
FIG. 3 is a side view of the fixing element according to FIG. 2 before being mounted on the printed-circuit board.
Figure 4:
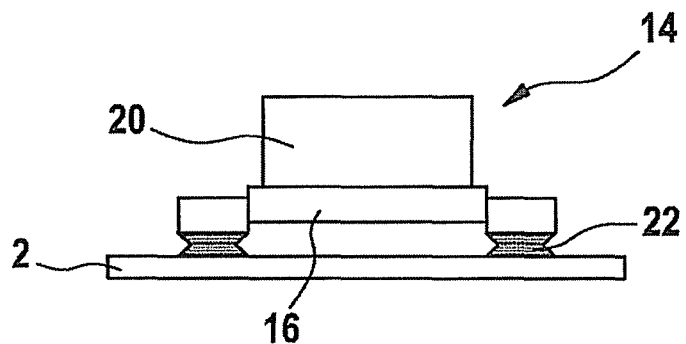
FIG. 4 is a side view of the fixing element according to FIG. 2 after being mounted on the printed-circuit board.
Figure 5:
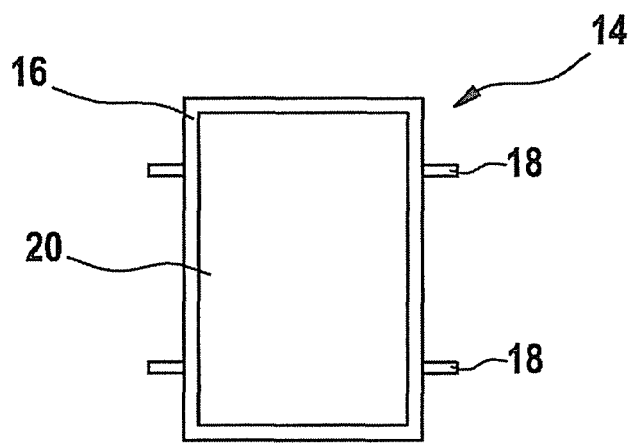
FIG. 5 is a top view of a modified fixing element.
Figure 6:
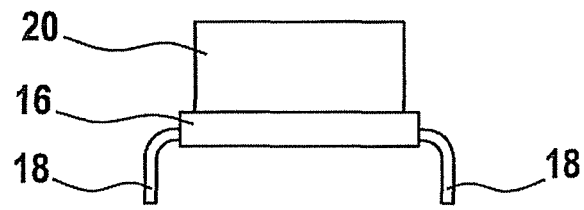
FIG. 6 is a side view of the fixing element according to FIG. 5 before being mounted on a printed-circuit board.

As is shown best in FIGS. 2, 3 and 4, fixing elements 14 are made up substantially of a base carrier 16, which is firmly soldered onto printed-circuit board 2 with the aid of four pins 18 that project laterally, and which is provided on its upper side, facing away from printed-circuit board 2, with an elastically yielding or deformable press-on part 20, with which housing projection 6 engages, in order to clamp in place printed-circuit board 2 between housing projection 6 and substratum 4.

Whereas base carrier 16 and pins 18 are made of a metal that is easy to solder and is electrically conductive, such as copper, press-on part 20, depending on the size of the tolerance to be compensated for and the exerted clamping force, may be made of an elastomer material, such as polyurethane foam or a thermoplastic elastomer (TPE), an elastically yielding thermoplastic material, such as polytetrafluoroethylene (PTFE) or a rubber elastic material, such as an ethylenepropylenediene rubber (EPDM) or a silicone, which is more or less severely elastically deformed when a clamping force is applied, and which returns to its initial position after being unstressed.

Figure 7:
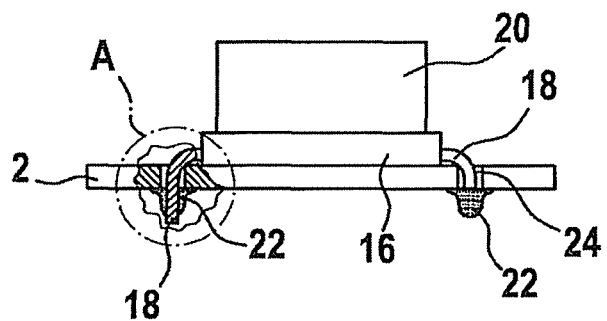
FIG. 7 is a partially sectioned side view of the fixing element according to FIG. 5 after being mounted on a printed-circuit board.
Figure 8:
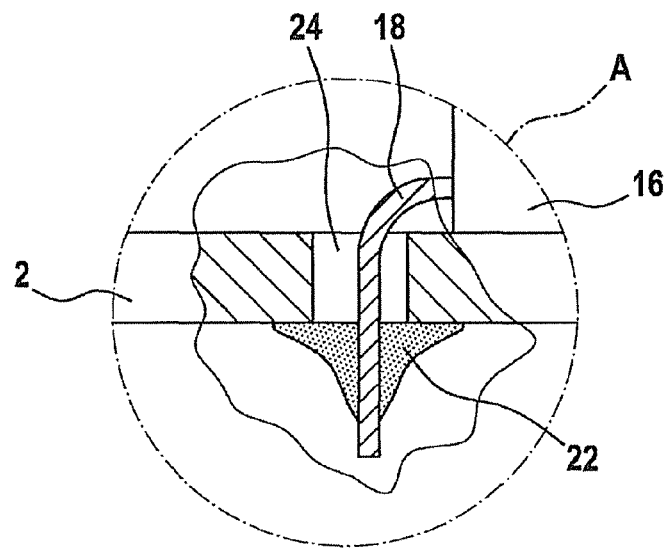
FIG. 8 is an enlarged view of cutaway portion A in FIG. 7.

Whereas fixing element 14 shown in FIGS. 2, 3 and 4 is mounted by the reflow soldering method on printed-circuit board 2, by having soft solder 22, that is used, applied before fitting printed-circuit board 2 with fixing element 14, below the provided contact surfaces of the flat pins 18 that are connected in one piece with the base carrier on the face of printed-circuit board 2, and is melted during the fitting with fixing element 14, fixing element 14 shown in FIGS. 5, 6, 7 and 8 is fastened by the usual soldering method on printed-circuit board 2, in that pins 18, that are wire-like and are bent over downwards and project beyond base carrier 16, are introduced from above into corresponding through bores 24 of printed-circuit board 2, and are connected rigidly to printed-circuit board 2 by firm soldering on the lower side of printed-circuit board 2, as soon as base carrier 16, by contrast to base carrier 16 of fixing element 14 shown in FIGS. 2, 3 and 4, lies with its underside on the face of printed-circuit board 2 (cf. FIG. 7).

Figure 9:
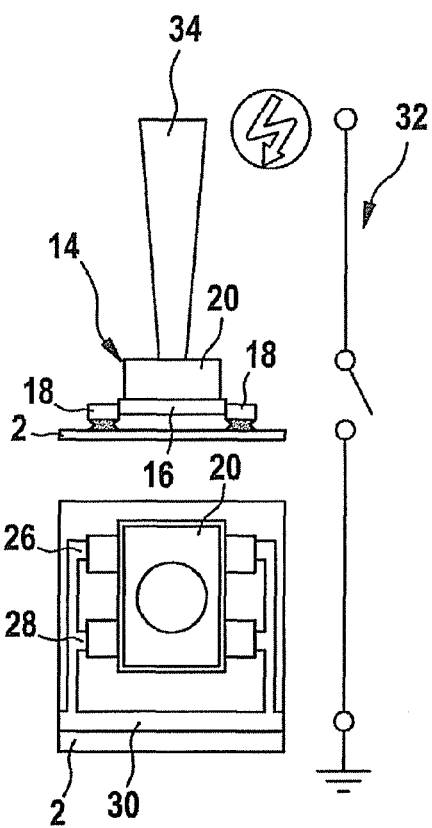
FIG. 9 is a side view and a top view of a part of a printed-circuit board having a fixing element that is in contact with ground, which has an electrically nonconductive press-on part.
Figure 10:
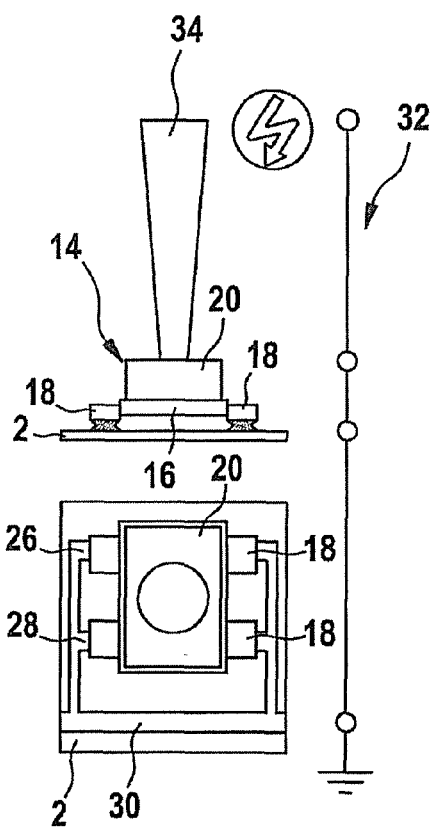
FIG. 10 is a side view and a top view of a part of a printed-circuit board having a fixing element that is in contact with ground, which has an electrically conductive press-on part.

By contrast to fixing elements 14 in FIG. 1, which are fastened to printed-circuit board 2 at a distance from the circuit traces (not shown), FIGS. 9 and 10 show a fixing element 14 whose pins 18 are soldered onto two circuit trace sections 26, 28, that are connected in parallel with a ground circuit trace 30 connected to ground. However, while press-on part 20 of fixing element 14 shown in FIG. 9 is made of an electrically nonconductive material, just as press-on parts 20 of fixing element 14 described above, so that a current path 32 between a tapered contact finger 34, used for clamping in place printed-circuit board 2, that is pressed from above against press-on part 20, of the housing, on the one hand, and ground conductor 30 of printed-circuit board 2, on the other hand, is interrupted in the vicinity of press-on part 20, press-on part 20 of fixing element 14 shown in FIG. 10 is made of an electrically conductive material, such as an elastomer filled with graphite, so that a contacting is produced via press-on part 20 between contact finger 34 and base carrier 16 of fixing element 14, and consequently, current path 32 between contact finger 34 and ground conductor 30 is closed when contact finger 34 is pressed against press-on part 20 of fixing element 14. In this manner, ground connections of components 8, 10, 12 that are mounted on printed-circuit board 2 and connected to ground conductor 30, for instance, are able to be connected via contact finger 34 to an external ground connection lying outside the housing.

While press-on parts 20 of fixing elements 14 shown in FIGS. 1 to 10 have a parallelepiped shape in the undeformed state, it may perhaps be more favorable, depending on the particular application, to give a different shape to press-on parts 20, as shown in FIGS. 1 to 17.

Figure 11:
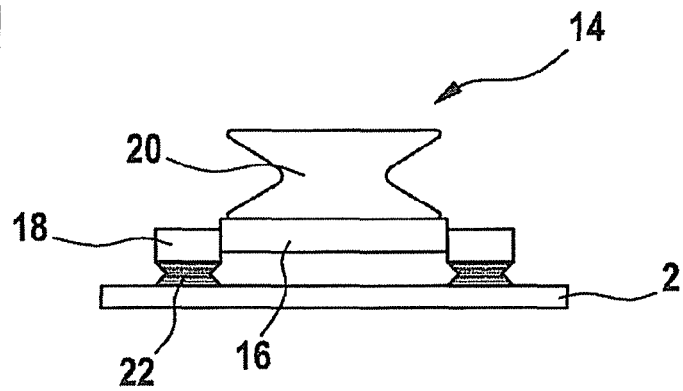
FIGS. 11 through 17 are side views and sectional views of fixing elements having differently shaped press-on parts.

FIG. 11, for example, shows a fixing element 14 having a press-on part 20 that is anvil-shaped in cross section, using which one is able to compensate for a possible slight inclination between the front of printed-circuit board 2 or base carrier 16 and a level housing part (not shown) lying against the upper side of press-on part 20. In this context, in a top view, press-on part 20 may have a square or rectangular outline or another outline that is not rotationally symmetrical, if the inclination occurs only in one direction, or a round outline if the inclination is able to occur in a directionally nonspecific manner.

Figure 12:
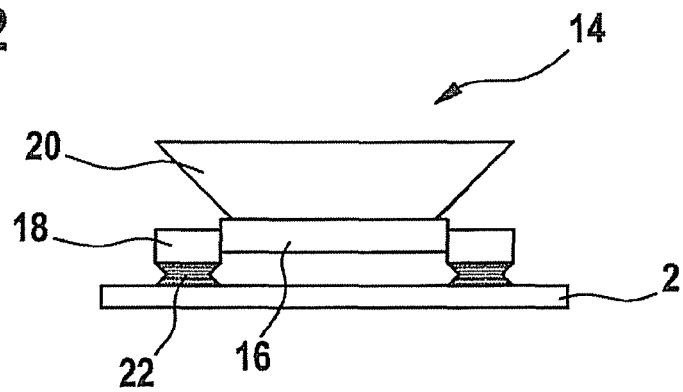

FIG. 12 shows a fixing element having a press-on part 20 that is trapezoidal in cross section, using which, while having the same area content of the upper side of base carrier 16, the contact area of press-on part 20 on the housing may be maximized, for instance, if press-on part 20 is lying with its upper side directly against the lower side of a housing cover, or the like.

Figure 13:
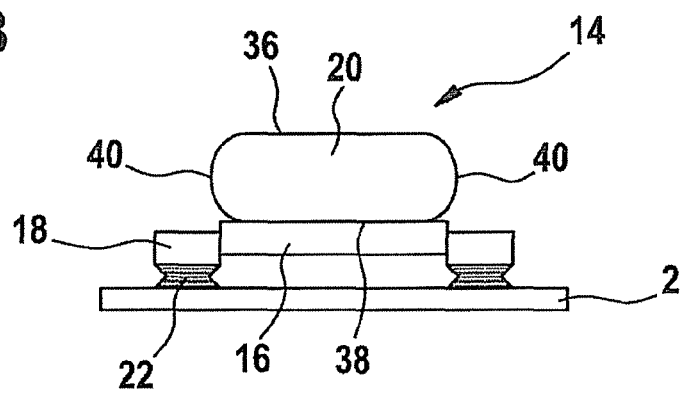

FIG. 13 shows a fixing element 14, whose press-on part 20 has a cross section having a flat upper and lower side 36, 38 and a convexly rounded side surface 40, for absorbing high stresses or clamping forces, and is preferably made of a rubber elastic material which is compressed only slightly in the vertical direction by a clamping force F exerted on upper side 36 of press-on part 20 (cf. FIG. 1).

Figure 14:
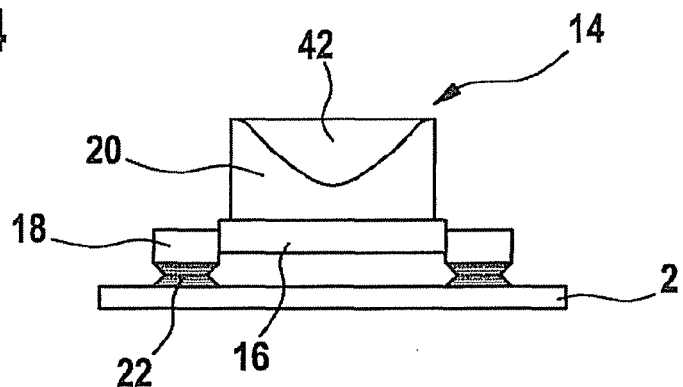

FIG. 14 shows a fixing element 14 having a press-on part 20, that is used for centering printed-circuit board 2 with respect to the housing, which, on its upper side 36, is provided with a rotationally symmetrical depression 42, which cooperates with a complementarily shaped end face (not shown) of a housing projection 6 or a contact finger 34, to bring the center axis of depression 42 and the housing projection into alignment.

Figure 15:
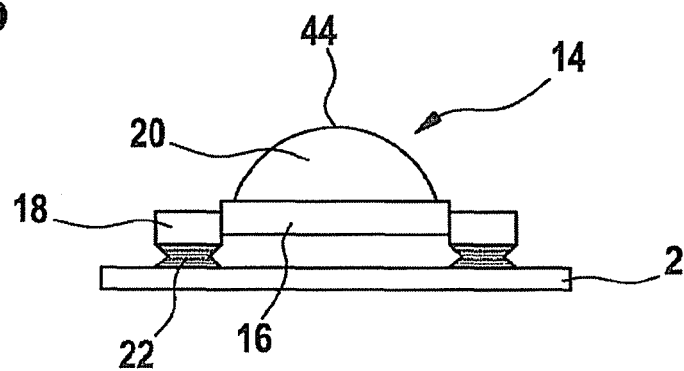

FIG. 15 shows a fixing element 14, whose press-on part 20 has a spherical surface 44, and with that, it is suitable for unspecified insertion positions, in which the clamping force F (cf. FIG. 1) that is exerted on press-on part 20 is applied to press-on part 20 of fixing element 14 in a direction that is not orthogonal to the front side or the back side of the printed-circuit board and/or is applied at a distance from the center.

Figure 16:
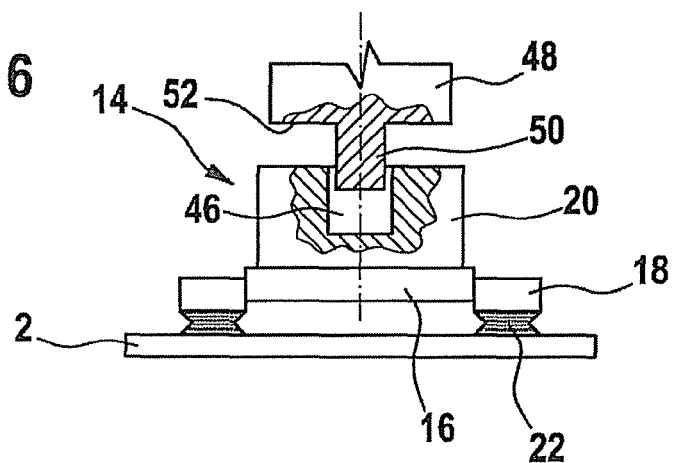

FIG. 16 shows a fixing element 14 having a press-on part 20, that is provided with a cylindrical depression 46, into which a pin or peg 50 projecting downwards beyond a housing part 48 engages, having a radial play, if an annular shoulder 52 that surrounds pin or peg 50 lies against the flat upper side of press-on part 20, around depression 46, or is pressed against it.

Figure 17:
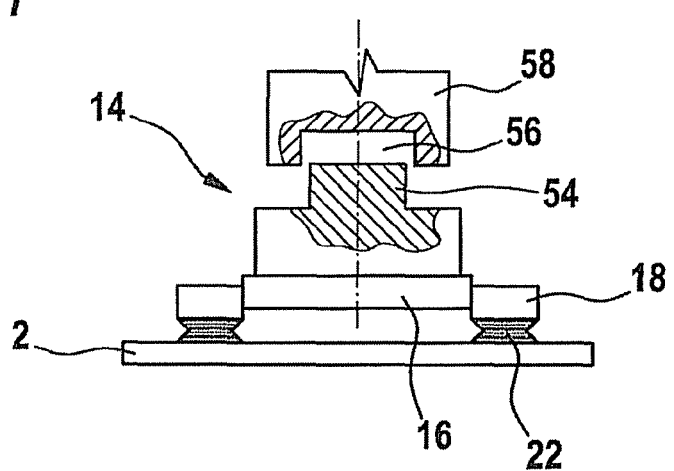

The same also applies for fixing element 14 that is shown in FIG. 17, whose elastically yielding press-on part 20 has an upwards projecting cylindrical projection 54, which also extends with radial play into a complementary accommodating depression 56, of a housing part 58, that cooperates with fixing element 14, if housing part 58 is pressed from above against press-on part 20 of fixing element 14, for the purpose of clamping in place printed-circuit board 2. In contrast to the press-on part in FIG. 16, projection 54 and depression 56 have larger cross sectional dimensions, and have a height or depth so that, at the first contact between housing part 58 and press-on part 20, only the end face of projection 54 is pressed against the floor of depression 56, and, only during the course of a beginning compression of press-on part 20, contact is produced between housing part 58 and press-on part 20 around depression 56 and projection 54.

What is claimed is:

1. A fixing element for fixing a component in a housing by clamping the component in place, comprising:
    a fastener device adapted to rigidly fasten on the component;
    an elastically yieldable press-on part which, during the clamping in position of the component in the housing, is adapted to be brought to lie against a part of the housing and to be pressed against the part of the housing during deformation;
    wherein the component includes at least one of (a) an electrical component, (b) an electronic component, and (c) a printed-circuit board,
    wherein the fastener device includes a plurality of soldering pins which project beyond the fixing element.

2. The fixing element according to claim 1, further comprising a rigid carrier provided with at least one part of the fastener device for being fastened on the component and which carries the elastically yielding press-on part.

3. The fixing element according to claim 1, wherein the fastener device includes an adhesive adapted to adhere the fixing element to the component.

4. The fixing element according to claim 1, wherein the plurality of soldering pins which project beyond the fixing element are connectable to the component by soldering.

5. The fixing element according to claim 1, wherein the press-on part is made at least in part of at least one of (a) an elastic plastic material, (b) an elastomeric material, and (c) a rubber elastic material.

6. The fixing element according to claim 1, wherein the press-on part is made at least partially of an electrically conductive material.

7. The fixing element according to claim 1, wherein the press-on part has a centering device adapted to center with respect to the housing.

8. The fixing element according to claim 1, wherein the press-on part has at least one of (a) an anvil-shaped and (b) a trapezoidal cross section.

9. The fixing element according to claim 1, wherein the press-on part has at least one of (a) rounded and (b) partially spherical peripheries.

10. The fixing element according to claim 1, wherein the press-on part has at least one of (a) a projection and (b) a depression adapted to cooperate with at least one of (a) a projection and (b) a depression of the housing.

11. A system, comprising:
    a component including at least one of (a) an electrical component, (b) an electronic component, and (c) a printed-circuit board; and
    at least one fixing element including:
    a fastener device adapted to rigidly fasten on the component; and
    an elastically yieldable press-on part which, during the clamping in position of the component in the housing, is adapted to be brought to lie against a part of the housing and to be pressed against the part of the housing during deformation,
    wherein the fastener device includes a plurality of soldering pins which project beyond the fixing element.

12. A method for fixing a component in a housing, comprising:
    clamping the component in place in the housing; and
    fitting the component with at least one fixing element that includes an elastically yielding press-on part which, during the clamping in place of the component in the housing, is brought to lie against a part of the housing and is pressed against the part of the housing while being deformed;
    wherein the component includes at least one of (a) an electrical component, (b) an electronic component, and (c) a printed-circuit board,
    wherein the fixing element is fastened to the component with the aid of a plurality of soldering pins which project beyond the fixing element.

13. The method according to claim 12, wherein the fixing element is fastened to the component by soldering.

14. The method according to claim 12, wherein the fixing element is fastened on the component by adhesion.

* * * * *